United States Patent [19]
Jandu et al.

[11] Patent Number: 5,917,363
[45] Date of Patent: *Jun. 29, 1999

[54] MULTIPLEXED DRIVER SYSTEM REQUIRING A REDUCED NUMBER OF AMPLIFIER CIRCUITS

[75] Inventors: Jaswinder Jandu, Austin, Tex.; John Pigott, Phoenix, Ariz.

[73] Assignee: Motorola, Inc., Schaumburg, Ill.

[ * ] Notice: This patent issued on a continued prosecution application filed under 37 CFR 1.53(d), and is subject to the twenty year patent term provisions of 35 U.S.C. 154(a)(2).

[21] Appl. No.: 08/667,751

[22] Filed: Jun. 21, 1996

[51] Int. Cl.$^6$ .............................. H03K 17/693
[52] U.S. Cl. ............................ 327/415; 327/94
[58] Field of Search ................ 327/52, 54, 63, 327/67, 90, 91, 93–96, 108, 109–112, 403, 407, 415–417

[56] References Cited

U.S. PATENT DOCUMENTS

| | | |
|---|---|---|
| 4,542,304 | 9/1985 | Swanson ................................ 327/95 |
| 4,563,588 | 1/1986 | Tanaka ................................. 327/91 |
| 4,781,437 | 11/1988 | Shields et al. ....................... 327/91 |
| 4,804,863 | 2/1989 | Welland et al. ..................... 327/91 |
| 4,875,041 | 10/1989 | Dannenberg ................... 340/870.13 |
| 5,359,237 | 10/1994 | Pye ...................................... 327/95 |
| 5,416,432 | 5/1995 | Lewis et al. ......................... 327/94 |

*Primary Examiner*—My-Trang Nu Ton
*Attorney, Agent, or Firm*—Susan C. Hill; Keith E. Witek

[57] ABSTRACT

A method (701–717) and apparatus for providing a driver system requiring a reduced number of amplifier circuits. Load driving circuitry (205) is configured to include a single loop amplifier (401) for sequentially receiving multiplexed signals representative of the parameter values and effecting the output of such signals to corresponding loads. Sample-and-hold circuitry is coupled between the output of the loop amplifier (401) and load circuitry within the driver circuits (409, 429, 435) in an arrangement such that only one loop amplifier (401) is required in a multiplexed multi-input system.

21 Claims, 3 Drawing Sheets

MULTIPLEXED DRIVER SYSTEM REQUIRING A REDUCED NUMBER OF AMPLIFIER CIRCUITS

FIELD OF THE INVENTION

The present invention relates generally to signal processing systems and more particularly to an improved integrated circuit apparatus and method for processing multiplexed parameter input signals and providing corresponding parameter output signals.

BACKGROUND OF THE INVENTION

In monitored and/or controlled systems, numerous parameters are monitored and displayed in order to make adjustments to the system when necessary if the monitored parameters are not within predetermined ranges. Such systems include applications in which safety and/or performance is a primary objective. Systems including such instrumentation are implemented in power plants, airplanes, automobiles and even satellites, just to name a few. In general, when a measured parameter value goes beyond a predetermined range of acceptable values, a correction is made either automatically by the system or by an operator who is monitoring the parameter values being measured. For example, in an automobile application, the engine coolant temperature may be one of the parameters being measured. The temperature is displayed on a gauge to an operator and when the temperature exceeds a certain value, the operator needs to take action to correct the situation.

As applications have become more complex and sophisticated, more and more integrated circuits have been designed and implemented to maximize system monitoring and control. In general, operators prefer a gauge indication of the value of a measured parameter rather than merely an indicator light because it permits greater awareness of a developing situation or a trend, and also allows the operator or the system to be more responsive and in control. Accordingly, the use of and applications for gauges have increased over the years. With the implementation of integrated circuitry and microcontrollers, including microprocessors, many more parameters can be measured and displayed to an operator, much more rapidly and accurately than ever before.

In many applications, none or very little of the processing circuitry is multiplexed. Multiplexing allows reduction of the number of components in the system and minimization of the space needed for the processing control circuitry. Multiplexing allows circuit sharing such that one circuit may be used to process the same information, in time sequence, for a plurality of measured parameters. In the past, systems have been implemented which utilize selected and separate blocks or addresses in memory to store measured parameter values so that the same processing circuitry, by sequentially addressing appropriate addresses in memory, can be multiplexed and shared by all of the measured parameters in processing and displaying measured parameter values.

While such system implementations have been of significant value in reducing the component count, integrated circuit chip size and integrated circuit cost, there is a continuing demand for further improvement in those design areas. For example, in the prior art gauge display systems, even with the above described improvements, each circuit used to process and effect the display of measured parameter information still requires a separate operational amplifier to drive the gauge display. In terms of integrated circuit or chip area, each operational amplifier may require, for example, up to 20% or more of the space taken by an on-board CPU. In most systems where there are a significant number of parameters to be monitored, the semiconductor integrated circuit area requirements of the operational amplifiers greatly exceed the area saved through the above described parameter-based memory addressing scheme.

For example, typical gauges in an automotive instrument cluster consist of orthogonally wound coils with a magnetized disk which is free to rotate in the coils. A pointer attached to the disk can be made to point to a known location by controlling the magnitude of the currents in the two coils. Typically the current can be set as the voltage across the coils or a current source can supply the current into the coil. To maintain the current in the coils, dedicated circuitry is used to set the current and hold it at a value representative of a measured value. This is usually a Digital-To-Analog Converter (DAC) driving dedicated coil driver amplifiers. Hence for a full cluster of six gauges (i.e. 12 coils), six DACs and twelve amplifiers are required. Similarly, for a current source approach, six DACs and twelve Voltage-to-Current (V-I) conversions would be required.

Thus there is a need for an improved method and apparatus for processing measured parameter information and displaying such information on display devices wherein such method and apparatus may be implemented using a substantially reduced number of component parts and a significantly smaller integrated circuit surface area.

BRIEF DESCRIPTION OF THE DRAWINGS

A better understanding of the present invention can be obtained when the following detailed description of a preferred embodiment is considered in conjunction with the following drawings, in which.

DESCRIPTION OF THE PREFERRED EMBODIMENT

A more detailed presentation of the method and apparatus discussed above is illustrated in the Figures, and described in connection with those Figures below. In the following description, a preferred embodiment for use in an automobile application is described although it is noted that the present invention is also applicable to many more systems including aerospace systems, power plant systems, aviation systems and others where output parameters are provided. For example, the present invention is applicable to a wide variety of systems where multiple parameters are measured and are used to provide control or are displayed.

The present example uses a multiplexed open-loop sample and hold scheme to reduce the number of components required to drive an instrument cluster in an automobile dashboard. In the illustrated embodiment of the present invention, a single DAC is shared with a single V-I converter to generate a reference voltage which is used to generate coil currents (see FIG. 2). Alternate embodiments of the present invention may not use a V-I converter. In the illustrated embodiment, a sample and hold circuit is used with each coil driver to maintain the current while other coils are being updated. This substantially reduces the component count and hence enables a cost effective system to be implemented on a single integrated circuit. In the disclosed circuit, continuous closed-loop control of the gauge driver is not required during the hold phase. Thus the loop-control amplifier can be shared amongst all channels in the system, thus reducing the total component count.

Figure 1:
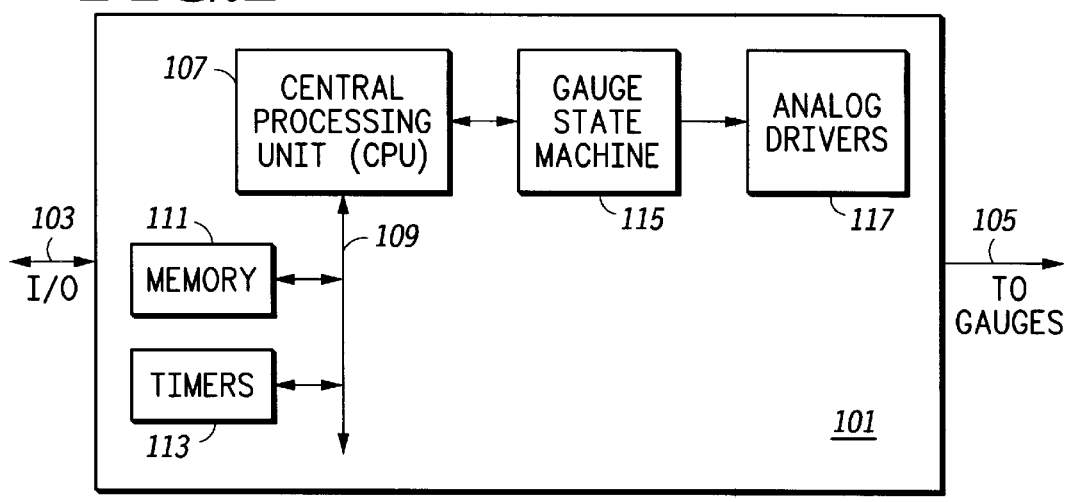
FIG. 1 is a schematic block diagram of an integrated circuit including a system within which an embodiment of the disclosed method and apparatus may be implemented.

More specifically, as shown in FIG. 1, an integrated circuit or chip 101 is arranged to receive input/output (I/O) signals 103 and provide output signals at output 105 for application to display gauges in the present example. The present example is implemented on a single chip but the inventive method and apparatus may also be implemented in several interconnected chips or boards using discrete components. Circuit 101 is a microcontroller chip which includes a CPU 107 coupled to a signal bus 109 for communicating with a memory 111, timer circuitry 113 and other support circuitry as may be specified for any particular application. The CPU 107 is also coupled to a gauge state machine 115 which operates to provide various control signals used by the system in implementing the signal processing method disclosed herein. The state machine 115 provides signals to the CPU 107 and also to the analog driver circuitry 117, which provides analog signals at the output 105 to the display gauges.

Figure 2:
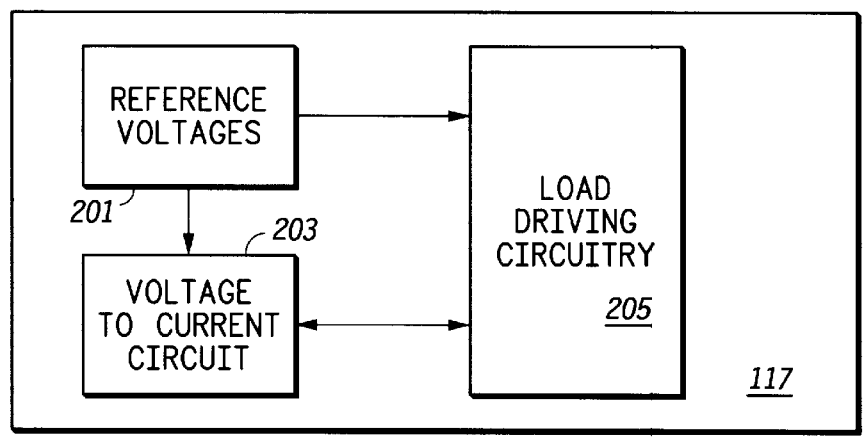
FIG. 2 is a schematic block diagram of the Analog Drivers block shown in FIG. 1.

FIG. 2 shows the analog driver circuitry 117 of FIG. 1 in more detail. The analog driver circuitry 117 includes a reference voltage source 201 which is coupled to a voltage-to-current circuit 203 and also to gauge driver circuitry 205 in order to provide a reference voltage to an optional voltage regulator in load driving circuitry 205. The voltage-to-current circuit 203 is also coupled to the load driving circuitry 205 to provide the driving currents required to drive the corresponding loads. The reference voltage circuitry 201 provides regulated voltage sources for application to the gauge drivers as hereinafter explained. Both the reference voltage circuitry 201 and the voltage-to-current circuitry 203 may be standard circuits for performing the indicated functions. Since such circuits are well known in the art, the details of such circuits will not be explained in any greater detail in order not to obfuscate the exemplary implementation of the present invention as herein disclosed.

Figure 3:
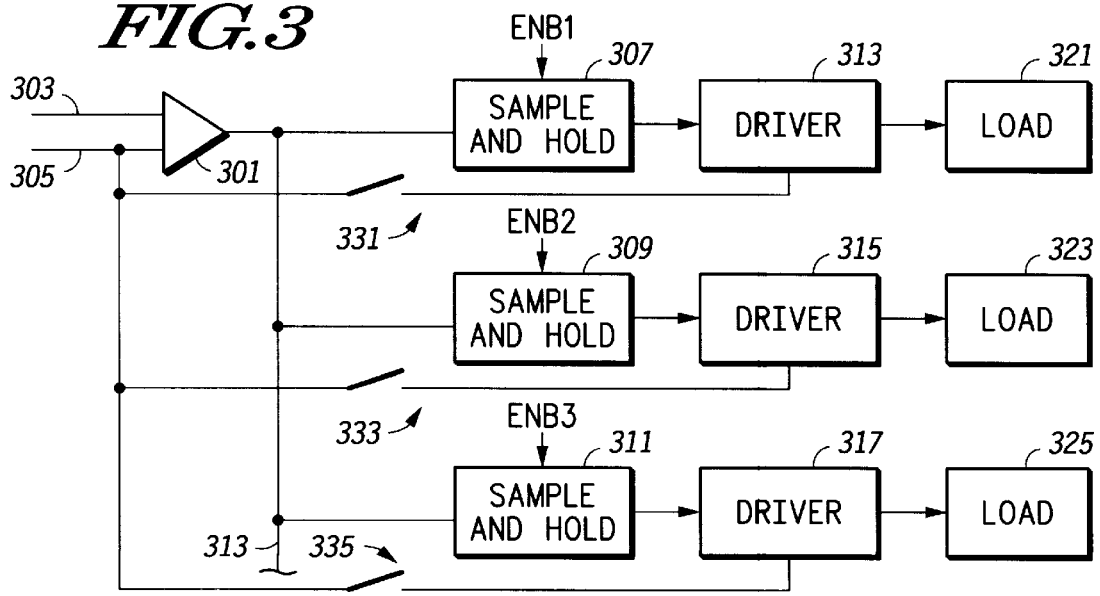
FIG. 3 is a schematic block diagram illustrating the operation of one embodiment of the disclosed invention.
Figure 6:
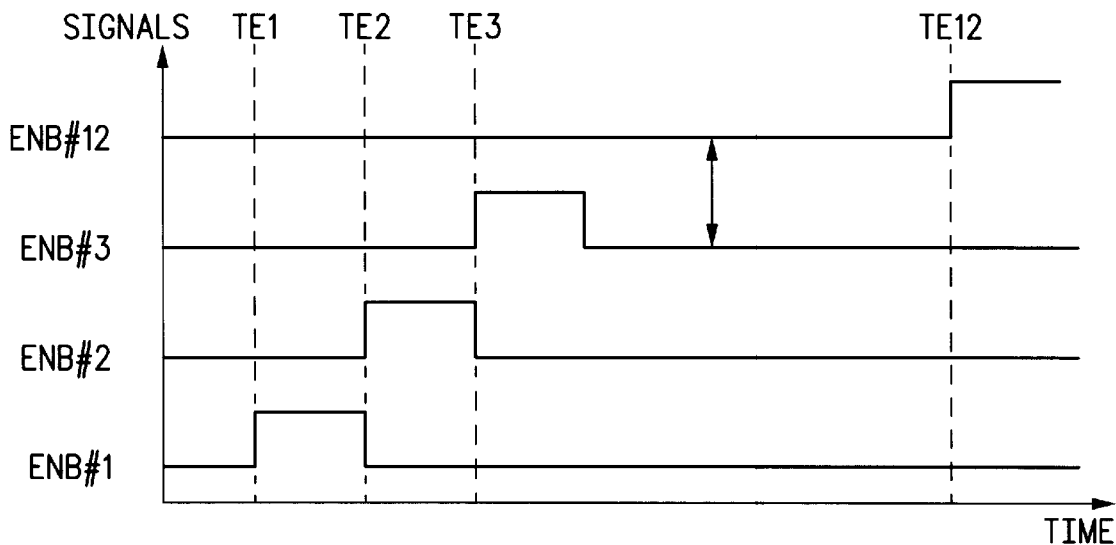
FIG. 6 is another timing chart illustrating the timing relationships among other signals generated during the operation of the disclosed processing circuitry.

FIG. 3 illustrates one embodiment of the present invention. An operational loop amplifier 301 receives inputs 303 and 305 and provides an output signal representative of the inputs, to a gauge bus 313 in the present example. The inputs to the loop amplifier 301 are representative of a measured system parameter at different points in time depending upon the number of parameters to be measured and displayed. The signal applied to the bus 313 is selectively applied to one of a series of sample-and-hold circuits 307, 309 and 311, depending upon which of the enable signals ENB1, ENB2, or ENB3 is present and effective to complete the circuit. The enable signals are generated sequentially as illustrated in FIG. 6 at sequential relative times TE1 for the first gauge coil to TE12, for example, in a six gauge system. Each of the sample-and-hold circuits is, in turn, coupled to a corresponding one of the drivers 313, 315, and 317, respectively, which are then used to drive a plurality of corresponding loads 321, 323, and 325 according to the value of the various parameters measured or required.

Although only drivers 313, 315, and 317 are indicated in FIG. 3, the system may be designed to accommodate whatever number of drivers are required in any given application to drive the necessary loads. As shown in FIG. 3, only one operational amplifier 301 is required to service a plurality of drivers (e.g. 313, 315, and 317), and thus a plurality of loads (e.g. 321, 323, and 325). As hereinbefore noted, since the amplifier can occupy around 20% of the chip area used by a CPU, the reduction in a twelve gauge system for example, from twelve amplifiers to only one amplifier, substantially reduces component part count as well as reducing the complexity and semiconductor area of the circuit.

Figure 5:
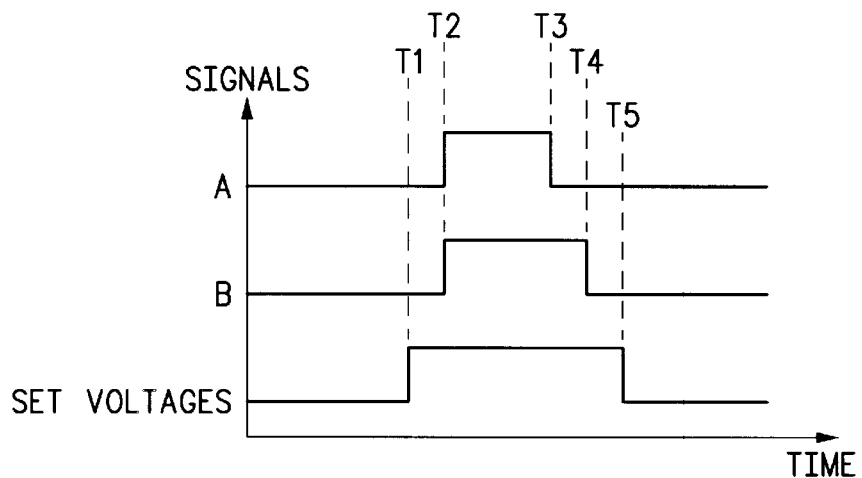
FIG. 5 is a timing chart showing the timing relationships among several of the signals generated during the operation of the disclosed exemplary embodiment.

Note that in the embodiment of the present invention illustrated in FIG. 3, the sample and hold circuit 307 and the feedback path 331 from driver 313 to amplifier input 305 are selectively enabled by signal ENB1. Likewise, the sample and hold circuit 309 and the feedback path 333 from driver 315 to amplifier input 305 are selectively enabled by signal ENB2. Similarly, the sample and hold circuit 311 and the feedback path 335 from driver 317 to amplifier input 305 are selectively enabled by signal ENB3. Alternate embodiments of the present invention may use the same or different signals to enable and disable the sample and hold circuits and the corresponding feedback path to the amplifier 301. Referring to FIG. 5, one embodiment of the present invention enables one sample and hold circuit (e.g. 307) and its corresponding feedback path (e.g. 331) at the same time, but disables the sample and hold circuit before disabling the feedback path.

Figure 4:
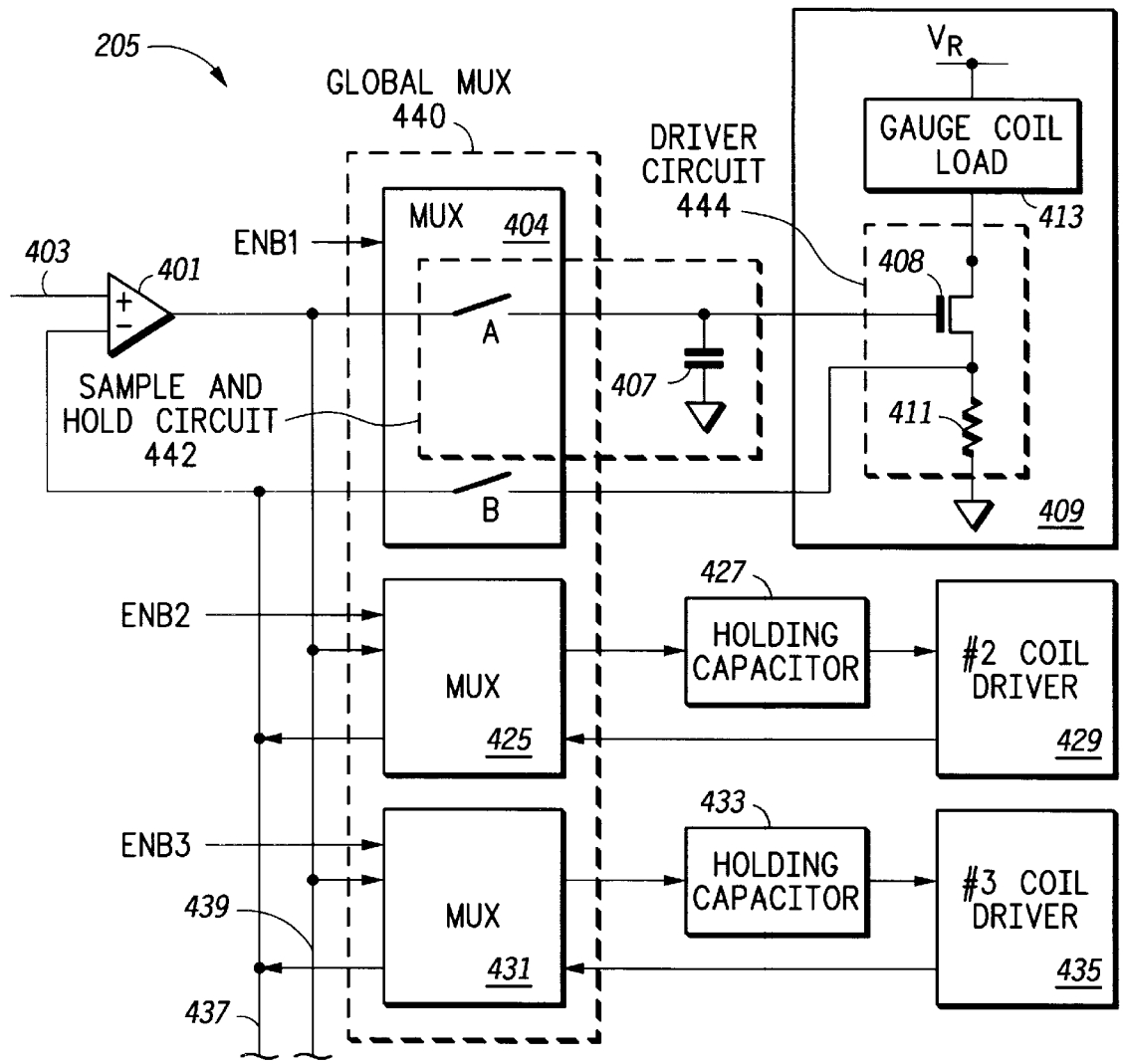
FIG. 4 is a more detailed illustration of one embodiment of the circuitry shown in FIG. 3.

FIG. 4 illustrates one embodiment of the load driving circuitry 205 (see FIG. 2) in further detail. An operational or loop amplifier 401 receives an input signal on line 403 and provides an output signal to a parameter signal bus or "A" bus 439. The parameter bus 439 is connected through an "A" switch of a multiplexor (MUX) 404 to a sample and hold capacitor 407. The second terminal of the hold capacitor 407 is connected to ground or a stable reference node. The switch "A" of MUX 404 and the holding capacitor 407 together operate as a sample and hold circuit 442 to sample an output from the amplifier 401 and to store that value on the capacitor 407 for subsequent application to a driver circuit 444. It should be noted that some systems may allow the hold capacitor 407 to be eliminated entirely if the gate-source and gate-drain capacitance of a load driver field effect transistor (FET) 408 is sufficient. In other words, the "holding" function may be implemented either through a separate holding capacitor 407 as illustrated, or merely through the inherent capacitance of the circuit configuration, for which circuit 409 is one example. In either case, there is a "holding" function implemented to hold a signal value representative of a measured parameter value. Driver circuit 444 may be used to drive a load, such as, for example, gauge coil load 413.

In alternate embodiments of the present invention, the sample and hold circuits (e.g. 442) may be implemented using any suitable circuitry, including any type of circuitry capable of acting as a memory to store a value. Likewise, the driver circuits (e.g. 444), the MUXes (e.g. 404, 425, 431, 404), the loads (e.g. 413), and the operational amplifier (e.g. 401) may be implemented using any suitable circuitry. Note also that the output of MUXes 404, 425, and 431 need only be representative of the output of operational amplifier 401.

For one embodiment of circuit 409, the first terminal of the holding capacitor 407 is further connected to a gate input terminal of a load driver FET transistor device 408. A first output terminal of the device 408 is connected to a top terminal of a resistor 411, the bottom terminal of which is connected to ground or a stable reference node. The top terminal of the resistor 411 is connected in a feedback configuration through a "B" switch of the MUX 404 to the second input terminal of the amplifier 401. The second input of the amplifier 401 is also connected to a "B" bus 437. A second terminal of the device 408 is connected through a gauge coil load 413 to a regulated voltage source "Vr". The device 408 together with the resistor 411 operate as a gauge driver 409 to drive the coils 413 of a display gauge. The device 408 is an FET in the present example, but may be implemented in various ways so long as the circuit has a high input impedance so that the sample-and-hold capacitor 407 is not loaded by the circuit, and also that the device be able to drive the load based on an input signal.

Global MUX 440 is used to selectively multiplex between the plurality of sample and hold circuits (e.g. 442). Note that holding capacitor 427 and path "A" in MUX 425 form a sample and hold circuit. Likewise, holding capacitor 433 and path "A" in MUX 431 form a sample and hold circuit. Global MUX 440 selectively enables and disables the forward path "A" and the feedback path "B" within each of MUXes 404, 425, and 431. In one embodiment of the present invention, only one of MUXes 404, 425, and 431 is enabled at a time, and when a MUX 404, 425, and 431 is enabled, both the forward path "A" and the feedback path "B" are conducting. In the embodiment of the present invention illustrated in FIG. 4, the signal ENB1 is used to enable and disable both the forward path "A" and the feedback path "B" in MUX 404. Likewise, the signal ENB2 is used to enable and disable both the forward path "A" and the feedback path "B" in MUX 425. Similarly, the signal ENB3 is used to enable and disable both the forward path "A" and the feedback path "B" in MUX 431. Note that alternate embodiments of the present invention may use different timing for the enabling and disabling of paths "A" and "B" (see FIG. 5).

In the present example, a plurality of gauge drivers, including a #2 gauge coil driver 429 and a #3 gauge coil driver 435, are shown. In general, the disclosed processing method is primarily designed to provide output signals. Such signals are useful in many systems for various control functions. For example, the output signals may be applied to drive indicator gauges and the number of gauges would depend upon the application. In an automobile gauge cluster for example, six gauges may be typical. For each output signal provided, there is a corresponding sample and hold operation, but there is only one operational amplifier 401 which is arranged to input to all of the sample and hold circuits in a selected sequence. As hereinbefore noted, since the disclosed circuit requires only one operational amplifier, significant savings in component count and semiconductor area can be realized.

In FIG. 4, all of the gauge driver circuits are connected to the "A" bus 439 and also the "B" bus 437. Each gauge driver 429 and 435 receives input signals from corresponding MUX switches 425 and 431, respectively, and corresponding holding capacitors 427 and 433, respectively. As illustrated in FIG. 6, enable signals ENB1–ENB12 are sequentially generated to sample the measured system parameter signals and provide output signals which may then be applied in various systems, such as the sequential application of the output signals to corresponding display gauges.

Figure 7:
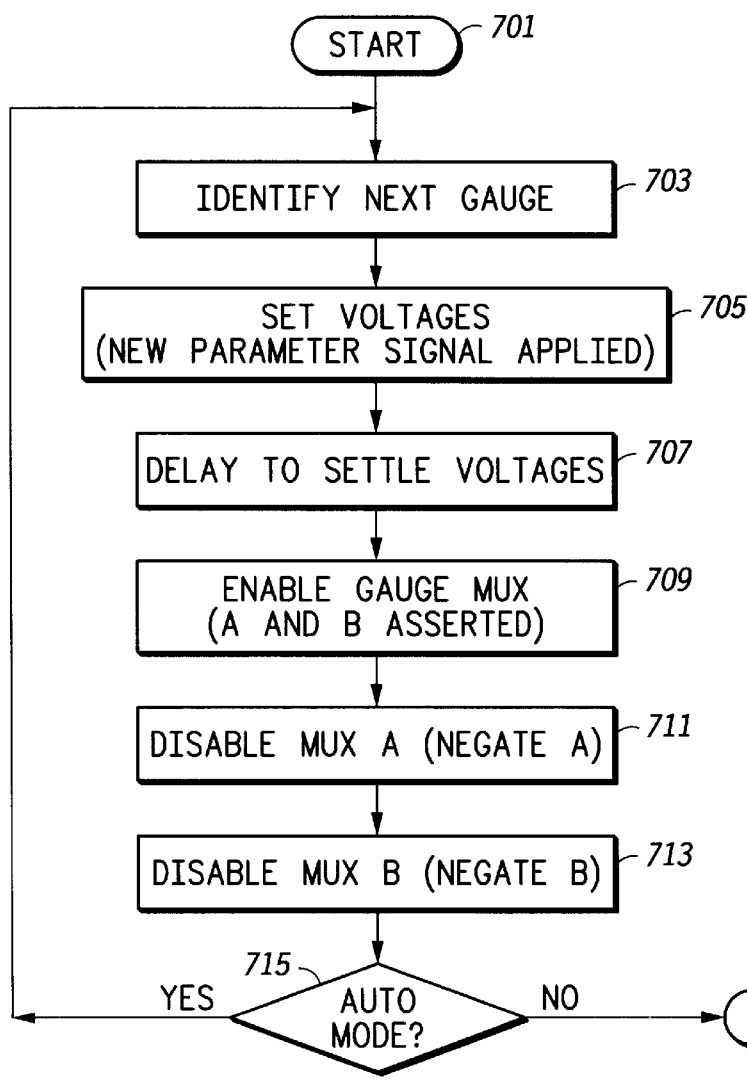
FIG. 7 is a flow chart illustrating the methodology implemented in the disclosed exemplary embodiment.

As the sequential enable signals are generated and applied throughout the system, there is a brief transient period encountered until the new signal values are established for the then current parameter being displayed. To accommodate for that transient state, the switching signals "A" and "B" follow a short delay after the new parameter signals are set or applied. The signal relationships are illustrated in FIG. 5 and the flow is shown in FIG. 7. As the system initiates operation 701, the next gauge in a series of gauges is identified 703. A "SET VOLTAGES" 705 high going pulse represents a point in time where a new parameter signal 403 is applied to the system. As illustrated, there is a slight delay, i.e. T2-T1, before the "A" and "B" switching signals are generated and the gauge MUX circuits are enabled 709. This allows for the voltages to settle 707 into a steady state condition.

After the input signal for a given gauge has been sampled and displayed on the appropriate gauge, the "A" signal goes low first 711 at time T3 thereby disabling MUX "A" and isolating the corresponding holding capacitor for the gauge being updated. Next the "B" MUX switch is disabled 713. Since the load does not change between update intervals, open-loop sustaining of the load current is sufficient, which allows the loop control amplifier 401 to be multiplexed together with the sample and hold circuitry. A determination is then made as to whether or not the system is in the AUTO MODE 715. If in the AUTO MODE, the method recycled to the "NEXT GAUGE" step 703 and processes the input for the next system parameter to be sampled and displayed. If not in the AUTO MODE 715, the process ends 717 until restarted.

The present invention herein disclosed, replaces the prior art replicated closed-loop sample-and-hold driver with a much simpler open-loop sample and hold driver, where the sample-and-hold signal still utilizes a closed-loop amplifier. Unlike the prior art, the present invention shares the sample-and-hold loop amplifier amongst all output channels and the resulting reduction in total circuit area is considerable.

The method and apparatus of the present invention has been described in connection with the preferred embodiment as disclosed herein. Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention.

We claim:

1. A circuit, comprising:
    load driving circuitry comprising:
        an amplifier device having a first input conductor and a second input conductor, said amplifier device providing an amplifier output signal;
        a sample and hold circuit, coupled to said amplifier device for receiving the amplifier output signal on a time multiplexed basis, said sample and hold circuit providing a sample and hold output signal;
        a driver circuit, coupled to said sample and hold circuit, said driver circuit having: (1) a resistive element with a first terminal coupled to a power supply terminal and a second terminal; and (2) a switching device having a first terminal coupled to the second terminal of the resistive element, a control terminal coupled to receive the sample and hold output signal, and an output terminal for providing a driver output signal of the driver circuit, the driver circuit also providing a feedback signal to said amplifier device on the time multiplexed basis by way of the second input conductor; and a gauge, coupled to said driver circuit via the output terminal of the driver circuit, said gauge receiving said driver output signal to drive said gauge;

a reference voltage circuit for providing a reference voltage to the load driving circuitry; and a voltage to current converter coupled to the reference voltage circuit for providing drive currents to the load driving circuitry.

2. A circuit as in claim 1, wherein said sample and hold circuit begins receiving the amplifier output signal at approximately a same time as said driver circuit begins providing the feedback signal to said amplifier device.

3. A circuit as in claim 1, wherein said sample and hold circuit stops receiving the amplifier output signal before said driver circuit stops providing the feedback signal to said amplifier device.

4. A circuit as in claim 1, further comprising:

a second sample and hold circuit, coupled to said amplifier device for receiving the amplifier output signal on the time multiplexed basis, said second sample and hold circuit providing a second sample and hold output signal; and a second driver circuit, coupled to said second sample and hold circuit, said second driver circuit receiving the second sample and hold output signal, providing a second driver output signal, and providing a second feedback signal to said amplifier device on a time multiplexed basis by way of the second input conductor.

5. A circuit as in claim 4, wherein said sample and hold circuit and said second sample and hold circuit do not receive the amplifier output signal concurrently.

6. A circuit as in claim 1, wherein said sample and hold circuit comprises:

a storage device.

7. A circuit as in claim 6, wherein said storage device comprises:

a capacitor, having a first terminal coupled to the driver circuit and having a second terminal coupled to a reference voltage.

8. Processing circuitry for processing a plurality of parameter input signals and providing corresponding parameter output signals, said processing circuitry comprising:

load driving circuitry comprising:

an amplifier device for receiving said plurality of parameter input signals in a predetermined sequence, said amplifier device being operable to provide amplifier output signals corresponding to said plurality of parameter input signals;

a plurality of switching circuits coupled to receive the amplifier output signals, each switching circuit in the plurality of switching circuits having an input switch coupled to receive the amplifier output signals and an output switch;

a plurality of storage devices, each storage device in the plurality of storage devices being coupled to the input switch of a respective switching circuit in the plurality of switching circuits to selectively receive the amplifier output signals, each of said plurality of storage devices being arranged for receiving and storing at least one of said amplifier output signals;

a plurality of driver circuits wherein each driver circuit in the plurality of driver circuits has a resistor coupled to a transistor wherein a node of the transistor that is not directly connected to resistor is an output node of the driver circuit, each one of said plurality of driver circuits being coupled to a corresponding one of said plurality of storage devices via the transistor;

a plurality of gauges, each one of said plurality of gauges being coupled to a corresponding one of said plurality of driver circuits via the output node of the corresponding one of said plurality of driver circuits;

a reference voltage generator circuit for generating a reference voltage output, the reference voltage output being coupled to the plurality of gauges; and switching means coupled so that each parameter input signal within said plurality of parameter input signals is provided to the plurality of switching circuits before selected ones of the plurality of switching circuits are enabled, said switching means also providing each parameter input signals within said plurality of parameter input signals for a time period after the selected ones of the plurality of switching circuits have been disabled;

a reference voltage circuit for providing a reference voltage to the load driving circuitry; and a voltage to current converter coupled to the reference voltage circuit for providing drive currents to the load driving circuitry.

9. The processing circuitry as set forth in claim 8, wherein each one of said plurality of driver circuits includes only a single capacitor comprising the corresponding one of said plurality of storage devices.

10. The processing circuitry as set forth in claim 8, wherein each one of said plurality of storage devices comprises a capacitor coupled to a ground terminal.

11. The processing circuitry as set forth in claim 8, further including a timing signal generator, said timing signal generator being selectively operable to generate a series of enabling signals for controlling said plurality of switching circuits.

12. The processing circuitry as set forth in claim 11, wherein said enabling signals comprise a series of pulses, wherein each of said pulses corresponds to a sampling time during which a corresponding one of said plurality of parameter input signals is sampled and applied to said amplifier device.

13. The processing circuitry as set forth in claim 11, wherein said amplifier output signals are selectively applied to a plurality of driver circuits in an iterative predetermined sequence.

14. The processing circuitry as set forth in claim 11 wherein said timing signal generator is further operable to generate a first switching signal, a first one of said switching devices being responsive to said first switching signal for effecting an application of a first one of said amplifier output signals to a first one of said plurality of storage devices.

15. The processing circuitry as set forth in claim 14, wherein said timing signal generator is further operable to generate a second switching signal, a second one of said switching devices being responsive to said second switching signal for completing an amplifier loop circuit between a load and said amplifier device.

16. The processing circuitry as set forth in claim 14 wherein a predetermined delay is established between corresponding ones of said enabling signals and associated sets of said first and second switching signals, said enabling signals being operable to effect sequential applications of said plurality of parameter input signals to said amplifier device, said predetermined delay being effective to allow said plurality of parameter input signals to settle to a steady state condition following an initiation of an enabling signal pulse.

17. The processing circuitry as set forth in claim 16 wherein said first and second switching signals are comprised of first and second pulses, respectively, each of said first and second pulses having an initiating pulse edge and a terminating pulse edge, said timing signal generator being operable to generate said terminating pulse edge for said second switching signal at a point in time following a predetermined isolation delay after a corresponding terminating pulse edge for said first switching signal, said plurality of storage devices being thereby effectively isolated to minimize signal loss from said plurality of storage devices in switching between sequential parameter input signals.

18. An amplifier circuit, comprising:
    an amplifier device, said amplifier device having first and second input terminals and an output terminal;
    a first switching device having a first terminal and a second terminal, said first terminal of said first switching device being coupled to said output terminal of said amplifier device;
    a single capacitive storage device, said single capacitive storage device having first and second terminals, said first terminal of said single capacitive storage device being coupled to said second terminal of said first switching device, said second terminal of said single capacitive storage device being coupled to a reference potential;
    a driver device having a resistor with a first terminal coupled to the reference potential and a second terminal coupled to a feedback node, the drive device also having a transistor that has a first current electrode coupled to the feedback node, a second current electrode coupled to provide a driver output signal, and a control electrode coupled to the first terminal of said single capacitive storage device;
    a second switching device having a first terminal and a second terminal, said first terminal of said second switching device being coupled to said second input terminal of said amplifier device, said second terminal of said second switching device being coupled to said the feedback node of the driver device, said second switching device selectively providing feedback from said driver device to said amplifier device;
    a reference voltage circuit for providing a reference voltage;
    a voltage to current converter coupled to the reference voltage circuit for providing drive currents;
    a gauge operably coupled to receive the drive currents and the reference voltage, the gauge being coupled to said driver device to receive the driver output signal, said gauge receiving the driver output signal to drive said gauge to display different reading over time.

19. The amplifier circuit as set forth in claim 18, wherein said first and second switching devices are selectively operable independently of each other.

20. The amplifier circuit as set forth in claim 18, wherein said first and second switching devices are selectively operable to switch to a closed position substantially simultaneously thereby establishing a closed-loop amplifier circuit.

21. The amplifier circuit as set forth in claim 20 wherein said first switching device is selectively operable to switch to an open position prior to a corresponding opening of said second switching device thereby establishing an open-loop amplifier circuit and decoupling said amplifier device from said driver device.

* * * * *